(12) United States Patent
Chen

(10) Patent No.: US 11,712,747 B2
(45) Date of Patent: Aug. 1, 2023

(54) WAFER PROCESSING METHOD

(71) Applicant: DISCO CORPORATION, Tokyo (JP)

(72) Inventor: Ye Chen, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 526 days.

(21) Appl. No.: 17/081,043

(22) Filed: Oct. 27, 2020

(65) Prior Publication Data

US 2021/0129260 A1 May 6, 2021

(30) Foreign Application Priority Data

Nov. 6, 2019 (JP) .................................. 2019-201191

(51) Int. Cl.
*B23K 1/00* (2006.01)
*B23K 20/02* (2006.01)
(Continued)

(52) U.S. Cl.
CPC .......... *B23K 20/023* (2013.01); *B23K 1/0016* (2013.01); *B23K 26/40* (2013.01);
(Continued)

(58) Field of Classification Search
CPC .. B23K 20/023; B23K 26/40; B23K 26/0622; B23K 26/082; B23K 26/34; B23K 26/352; B23K 26/402; B23K 2103/56; B23K 1/0016; B23K 2101/36–42; H01L 21/3043; H01L 21/447; H01L 21/78; H01L 2221/68327; H01L 2221/6834; H01L 21/67092; H01L 21/67103;
(Continued)

(56) References Cited

U.S. PATENT DOCUMENTS

2005/0202597 A1* 9/2005 Takahashi ............... H01L 24/05
438/15
2007/0023136 A1* 2/2007 Priewasser .............. H01L 21/78
156/256

(Continued)

FOREIGN PATENT DOCUMENTS

CN 103192459 A * 7/2013 ............. H01L 21/78
CN 103715117 A * 4/2014 ....... H01L 21/67132
(Continued)

*Primary Examiner* — Kiley S Stoner
(74) *Attorney, Agent, or Firm* — Greer Burns & Crain Ltd.

(57) ABSTRACT

A wafer processing method for processing a wafer formed on a front surface thereof with a plurality of devices having projection-shaped electrodes, the devices being partitioned by streets, includes a cutting step of holding a back surface of the wafer by a holding surface of a chuck table and cutting head portions of the projection-shaped electrodes by a cutting tool slewed in parallel to the holding surface, to make uniform the electrodes in height and expose metallic surfaces; a thermocompression bonding sheet laying step of laying a thermocompression bonding sheet on the front surface of the wafer; a thermocompression bonding step of heating and pressing the thermocompression bonding sheet to perform thermocompression bonding; and a peeling step of peeling off the thermocompression bonding sheet from the wafer, before dividing the wafer into individual device chips and bonding the electrodes to a circuit board.

16 Claims, 6 Drawing Sheets

(51) Int. Cl.
*H01L 21/78* (2006.01)
*H01L 21/304* (2006.01)
*B23K 26/40* (2014.01)
*H01L 21/447* (2006.01)

(52) U.S. Cl.
CPC ........ *H01L 21/3043* (2013.01); *H01L 21/447* (2013.01); *H01L 21/78* (2013.01)

(58) Field of Classification Search
CPC ........... H01L 21/67132; H01L 21/6835; H01L 21/6836; H01L 2221/68386; H01L 21/563; H01L 2021/60022; C08J 5/18; C08J 2323/06; C08J 2325/06; C08J 2367/02
USPC ................. 228/170, 174, 179.1–180.22, 214
See application file for complete search history.

(56) References Cited

U.S. PATENT DOCUMENTS

| | | | | |
|---|---|---|---|---|
| 2018/0068895 A1* | 3/2018 | Sandoh | ............... | H01L 21/3065 |
| 2018/0108565 A1* | 4/2018 | Sekiya | ............. | H01L 21/76894 |
| 2019/0348326 A1* | 11/2019 | Harada | ............. | H01L 21/67109 |
| 2019/0348327 A1* | 11/2019 | Harada | ............. | H01L 21/67132 |
| 2019/0378745 A1* | 12/2019 | Harada | ..................... | C09J 5/06 |
| 2019/0378758 A1* | 12/2019 | Harada | ..................... | C09J 7/241 |
| 2020/0013675 A1* | 1/2020 | Harada | ............... | H01L 21/6836 |
| 2020/0013676 A1* | 1/2020 | Harada | ............... | H01L 21/67132 |
| 2020/0043772 A1* | 2/2020 | Harada | ............... | H01L 21/6836 |
| 2020/0043789 A1* | 2/2020 | Harada | .................. | H01L 21/78 |
| 2020/0083103 A1* | 3/2020 | Harada | ............... | H01L 21/67132 |
| 2020/0083104 A1* | 3/2020 | Harada | ............. | H01L 21/67092 |
| 2020/0126799 A1* | 4/2020 | Harada | ............. | H01L 21/02126 |
| 2020/0126859 A1* | 4/2020 | Harada | ............. | H01L 21/67115 |
| 2020/0144048 A1* | 5/2020 | Harada | ............... | H01L 21/2007 |
| 2020/0144049 A1* | 5/2020 | Harada | ............. | H01L 21/67115 |
| 2020/0176316 A1* | 6/2020 | Powers | ............... | H01L 21/3043 |
| 2020/0185252 A1* | 6/2020 | Harada | .................. | H01L 21/268 |
| 2020/0185253 A1* | 6/2020 | Harada | ...................... | C09J 5/06 |
| 2020/0235010 A1* | 7/2020 | Harada | ............. | H01L 21/68778 |
| 2020/0235011 A1* | 7/2020 | Harada | ............... | H01L 21/6836 |
| 2020/0266090 A1* | 8/2020 | Harada | ............... | B23K 26/0665 |
| 2020/0266102 A1* | 8/2020 | Harada | ............... | H01L 21/6836 |
| 2020/0286784 A1* | 9/2020 | Harada | ............... | H01L 21/6836 |
| 2020/0286785 A1* | 9/2020 | Harada | ............... | H01L 21/6836 |
| 2020/0328117 A1* | 10/2020 | Harada | ............. | H01L 21/67092 |
| 2020/0328118 A1* | 10/2020 | Harada | .................. | H01L 21/78 |
| 2020/0357695 A1* | 11/2020 | Harada | ............. | H01L 21/67132 |
| 2020/0357696 A1* | 11/2020 | Harada | ............... | H01L 21/6836 |
| 2020/0388536 A1* | 12/2020 | Harada | ..................... | C09J 7/241 |
| 2021/0013101 A1* | 1/2021 | Harada | .................. | H01L 23/544 |
| 2022/0154043 A1* | 5/2022 | Han | ......................... | C09J 7/30 |
| 2022/0181208 A1* | 6/2022 | Tian | ........................ | H01L 24/27 |

FOREIGN PATENT DOCUMENTS

| | | | | | |
|---|---|---|---|---|---|
| CN | 105810633 | A | * | 7/2016 | ............. B23K 26/38 |
| CN | 109287125 | A | * | 1/2019 | ............. B32B 27/08 |
| CN | 111180367 | A | * | 5/2020 | ............. B32B 37/10 |
| CN | 112053993 | A | * | 12/2020 | ............ B23K 26/364 |
| DE | 102019205063 | A1 | * | 10/2019 | ............. B32B 37/02 |
| DE | 102019211538 | A1 | * | 2/2020 | ............ B23K 26/364 |
| JP | 2000319697 | A | | 11/2000 | |
| JP | 2007036292 | A | * | 2/2007 | ......... H01L 21/6836 |
| JP | 2019192718 | A | * | 10/2019 | ............. B23K 26/38 |
| JP | 2019193959 | A | * | 11/2019 | ....... H01L 21/67092 |
| KR | 20190122551 | A | * | 10/2019 | |
| KR | 20200052233 | A | * | 5/2020 | |
| TW | 202035604 | A | * | 10/2020 | .............. C09J 11/06 |

* cited by examiner

WAFER PROCESSING METHOD

BACKGROUND OF THE INVENTION

Field of the Invention

The present invention relates to a wafer processing method for processing a wafer formed on a front surface thereof with a plurality of devices having projection-shaped electrodes, the devices being partitioned by streets.

Description of the Related Art

A wafer formed on a front surface thereof with a plurality of devices such as integrated circuits (ICs) and large-scale integrated circuits (LSIs), the devices being partitioned by streets, has a back surface thereof ground by a grinding apparatus to a predetermined thickness, and is thereafter divided into individual device chips, which are used for electric apparatuses such as mobile phones and personal computers.

In addition, a wafer formed on a front surface thereof with a plurality of devices having projection-shaped electrodes is conveyed to a cutting apparatus, for making uniform head portions (top portions) of the electrodes in height and for removing an oxide film and/or contaminants on surfaces thereof, a back surface of the wafer is held on a holding surface of a chuck table, and the head portions of the projection-shaped electrodes (bumps) are cut by a cutting tool slewed in parallel to the holding surface (see, for example, Japanese Patent Laid-open No. 2000-319697).

SUMMARY OF THE INVENTION

The wafer conveyed to the cutting apparatus, where the head portions of the projection-shaped electrodes are cut to be made uniform in height and metallic surfaces of the electrodes are exposed, is in a state suitable for bonding, but the wafer is not necessarily divided into individual device chips and subjected to a bonding step immediately after the head portions of the electrodes are cut. As time elapses, an oxide film may be formed on the metallic surfaces of the electrodes, and contaminants may be adhered to the electrodes in some storage conditions, which may hamper the bonding in a subsequent step.

It is accordingly an object of the present invention to provide a wafer processing method which ensures that even when time elapses after head portions of projection-shaped electrodes are cut, bonding performed thereafter is not hampered.

In accordance with an aspect of the present invention, there is provided a wafer processing method for processing a wafer formed on a front surface thereof with a plurality of devices having projection-shaped electrodes, the devices being partitioned by streets, the wafer processing method including a cutting step of holding a back surface of the wafer by a holding surface of a chuck table and cutting head portions of the projection-shaped electrodes by a cutting tool slewed in parallel to the holding surface, to make uniform the electrodes in height and to expose metallic surfaces of the electrodes, a thermocompression bonding sheet laying step of laying a thermocompression bonding sheet on the front surface of the wafer, a thermocompression bonding step of heating and pressing the thermocompression bonding sheet to perform thermocompression bonding, and a peeling step of peeling off the thermocompression bonding sheet before dividing the wafer into individual device chips and bonding the electrodes to a circuit board.

In the described aspect of the present invention, the wafer processing method preferably includes a plating step of forming a plating layer on the metallic surfaces formed at the head portions of the electrodes, after the cutting step but before performing the thermocompression bonding step.

In addition, in the described aspect of the present invention, the thermocompression bonding sheet is preferably a polyolefin-based sheet or a polyester-based sheet. The thermocompression bonding sheet is preferably one of a polyethylene sheet, a polypropylene sheet, a polystyrene sheet, a polyethylene terephthalate sheet, and a polyethylene naphthalate sheet. Further, the heating temperature at the time of heating the thermocompression bonding sheet in the thermocompression bonding step is preferably 120° C. to 140° C. in the case where the polyethylene sheet is selected as the thermocompression bonding sheet, preferably 160° C. to 180° C. in the case where the polypropylene sheet is selected, preferably 220° C. to 240° C. in the case where the polystyrene sheet is selected, preferably 250° C. to 270° C. in the case where the polyethylene terephthalate sheet is selected, and preferably 160° C. to 180° C. in the case where the polyethylene naphthalate is selected.

According to the wafer processing method according to the described aspect of the present invention, during the period after the head portions of the electrodes are cut and until the wafer is divided into individual device chips and bonded, the electrodes are shielded from the outside air, so that oxidation and/or contamination of the metallic surfaces of the electrodes is avoided, and bonding is less likely to be hampered.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of a wafer processing method of the present invention will be described in detail below, referring to the attached drawings.

Figure 1:
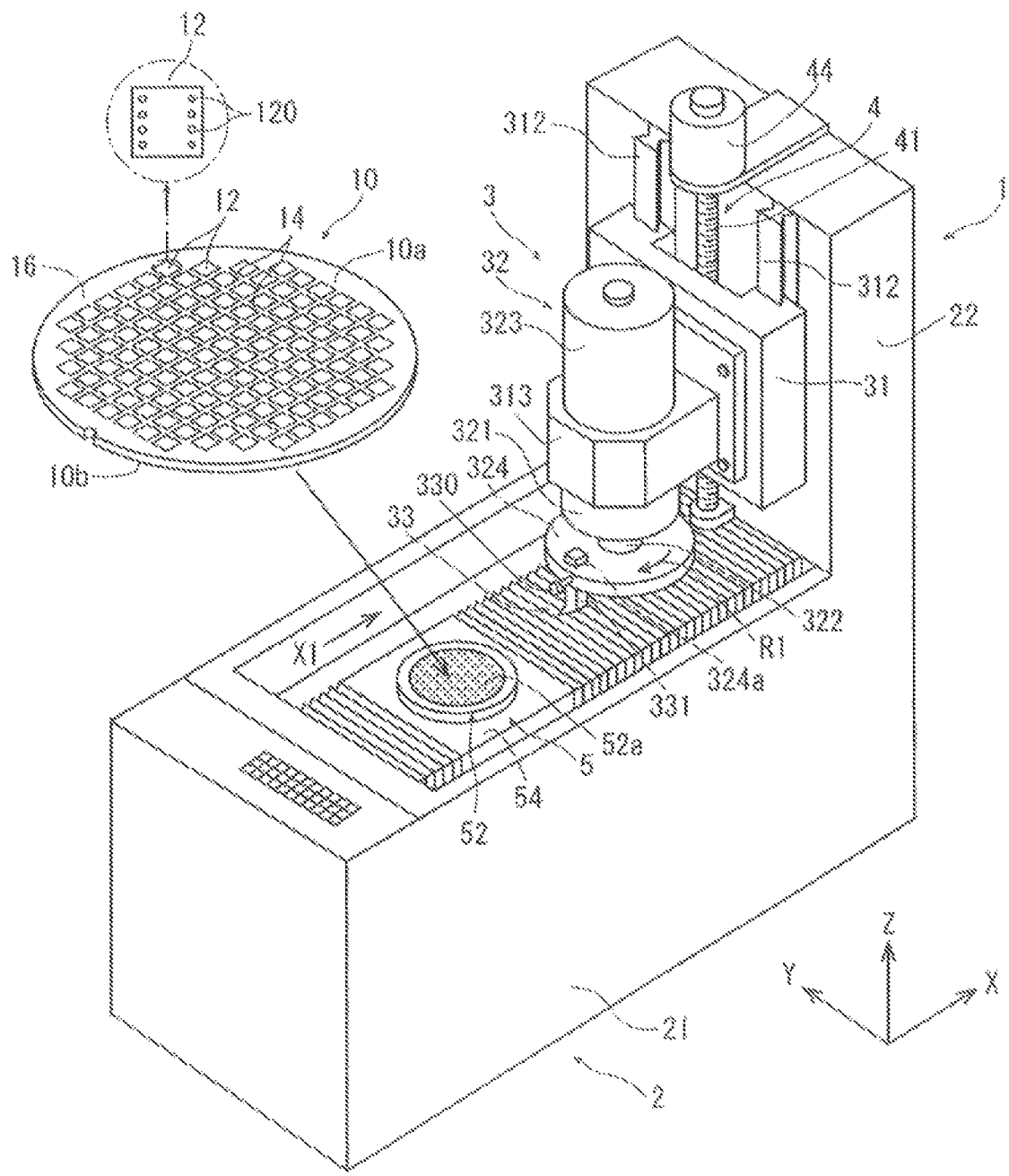
FIG. 1 is a general perspective view of a cutting apparatus suitable for carrying out a cutting step in the present embodiment.

FIG. 1 depicts a general perspective view of a cutting apparatus 1 suitable for carrying out a cutting step in the present embodiment. The cutting apparatus 1 includes an apparatus housing 2. The apparatus housing 2 includes a substantially parallelepiped-shaped main section 21 and an upright wall 22 that is provided at a rear end portion (a right upper end in FIG. 1) of the main section 21 and extending substantially vertically. A pair of guide rails 312 extending in the vertical direction is provided on a front surface of the upright wall 22. A cutting unit 3 as cutting means is vertically movably mounted to the pair of guide rails 312.

The cutting unit 3 includes a moving base 31 and a spindle unit 32 mounted to the moving base 31. The moving base 31 is formed with guided grooves for slidable engagement with the pair of guide rails 312. A support member 313 is mounted to a front surface of the moving base 31 slidably mounted to the pair of guide rails 312 provided on the upright wall 22, and the spindle unit 32 is attached to the support member 313.

The spindle unit 32 includes a spindle housing 321 mounted to the support member 313; a rotating spindle 322 disposed rotatably in the spindle housing 321; and a servo motor 323 as a drive source for rotationally driving a rotating spindle 322. A lower end portion of the rotating spindle 322 projects downward beyond a lower end of the spindle housing 321 and is provided at its lower end portion with a disk-shaped cutting tool member mounting member 324.

The cutting tool member mounting member 324 is provided with a cutting tool mounting hole 324a penetrating a part of an outer peripheral portion spaced from a rotational axis in the vertical direction. A cutting tool 331 constituting a cutting tool member 33 is inserted in the cutting tool mounting hole 324a, and a fastening bolt 330 is brought into screw engagement through a female screw hole formed at a lateral side of the cutting tool member mounting member 324 and is fastened, thereby fixing the cutting tool 331. Note that the cutting tool 331 is formed in a rod shape from a tool steel such as sintered hard alloy, and a cutting blade formed from diamond or the like is provided at a lower tip portion of the cutting tool 331, in the depicted embodiment. With the rotating spindle 332 rotated, the cutting tool member 33 mounted to the cutting tool member mounting member 324 configured as described above is rotated in the direction indicated by an arrow R1 together with the cutting tool member mounting member 324.

The cutting apparatus 1 illustrated includes a cutting-in feeding mechanism 4 for moving the cutting unit 3 in the vertical direction (the direction indicated by an arrow Z) along the pair of guide rails 312. The cutting-in feeding mechanism 4 includes a male screw rod 41 disposed on the front side of the upright wall 22 and extending substantially vertically. The male screw rod 41 is rotatably supported by a bearing member of which an upper end portion and a lower end portion are attached to the upright wall 22. A pulse motor 44 as a drive source for rotationally driving the male screw rod 41 fixed to the upright wall 22 is disposed at an upper end portion of the male screw rod 41, and an output shaft of the pulse motor 44 is connected to the male screw rod 41. A rear surface of the moving base 31 is formed with a connection section (not illustrated) projecting rearward from a width directionally central portion of the rear surface, and the male screw rod 41 is put in screw engagement with a female screw hole formed in the connection section. Therefore, when the pulse motor 44 is rotated normally, the cutting unit 3 is lowered together with the moving base 31, and when the pulse motor 44 is rotated reversely, the cutting unit 3 is raised together with the moving base 31.

A chuck table mechanism 5 is disposed on an upper surface of the main section 21 of the apparatus housing 2. The chuck table mechanism 5 includes a disk-shaped chuck table 52 disposed rotatably. At an upper surface of the chuck table 52, a holding surface is configured by a gas-permeable suction chuck 52a, which is connected to an unillustrated suction source, and by operating the suction source, a negative pressure is caused to act on the holding surface. The chuck table mechanism 5 includes an unillustrated moving mechanism accommodated in the inside of the main section 21, the chuck table 52 can be moved together with a cover member 54 in the direction indicated by an arrow X1, and the chuck table 52 can be reciprocated between a workpiece conveying-in/out region where the chuck table 52 is located in FIG. 1 and a processing region under the spindle unit 32.

The cutting apparatus 1 depicted in FIG. 1 is configured generally as above, and the cutting step in the wafer processing method of the present embodiment to be carried out using the above-described cutting apparatus 1 will be described below.

A workpiece in the present embodiment is, for example, a wafer 10 including a semiconductor formed on a front surface 10a thereof with a plurality of devices 12, which are partitioned by streets 14, as illustrated in FIG. 1. As a part of the wafer 10 is depicted in an enlarged form on the upper side in the figure, each device 12 is formed with a plurality of projection-shaped electrodes 120.

Figure 2A:
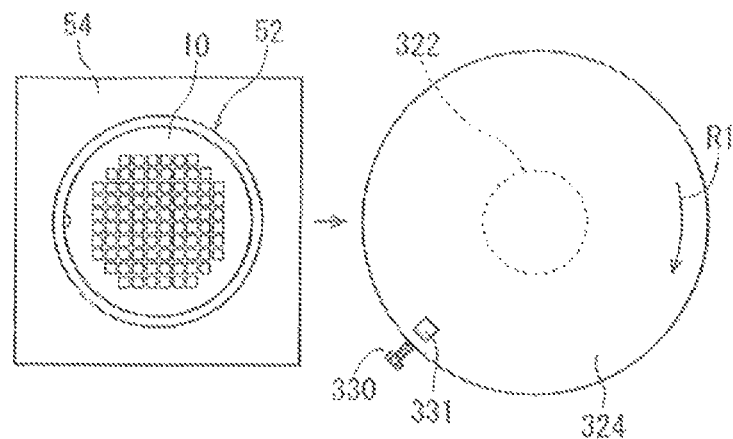
FIG. 2A is a plan view depicting an embodiment of the cutting step.
Figure 2B:
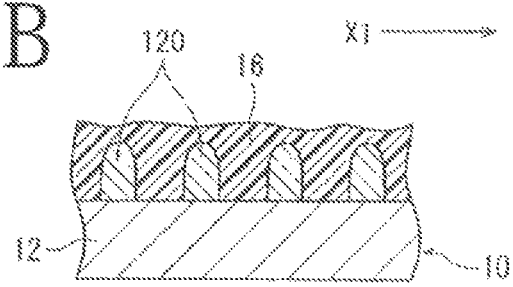
FIG. 2B is a partial enlarged sectional view of a wafer.

In FIG. 2A, the wafer 10 before being subjected to cutting and in the state of being mounted on and held under suction on the chuck table 52 located in the workpiece conveying-in/out region and the cutting tool member mounting member 324 are illustrated in plan views. FIG. 2B depicts a partial enlarged sectional view of the wafer 10. As depicted in FIG. 2B, a front surface of the wafer 10 formed with the devices 12 is coated with an under filling material 16 including a synthetic resin, and the projection-shaped electrodes 120 formed on the devices 12 are in an embedded state.

Figure 2C:
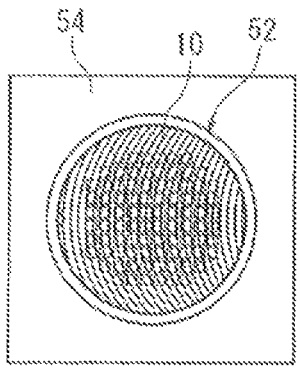
FIG. 2C is a plan view of the wafer after the cutting step.
Figure 2D:
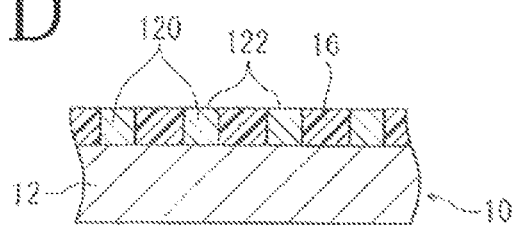
FIG. 2D is a partial enlarged sectional view of the wafer after the cutting step.

After the wafer 10 is held under suction on the chuck table 52, the servo motor 323 of the spindle unit 32 described based on FIG. 1 is driven to rotate the cutting tool member mounting member 324 in the direction indicated by the arrow R1, and the cutting-in feeding mechanism 4 is operated to lower the cutting tool member mounting member 324 to a predetermined height such as to cut the under filling material 16 on the wafer 10 and a part of the head portion of each electrode 120. Unillustrated moving means is operated to move the chuck table mechanism 5 in the direction indicated by the arrow X1 in FIG. 2A, and the chuck table 52 holding the wafer 10 is passed through the working region under the cutting tool member mounting member 324. When the chuck table 52 holding the wafer 10 is thus passed through the processing region, the wafer 10 is cut by the cutting tool 331 slewed in parallel to the holding surface of the chuck table 52, as illustrated in FIG. 2C. As a result, as depicted in FIG. 2D, the projection-shaped electrodes 120 are made uniform in the height of the head portions, and metallic surfaces 122 are formed and exposed on the surface of the under filling material 16 cut simultaneously. By these operations, the cutting step is completed.

Figure 3A:
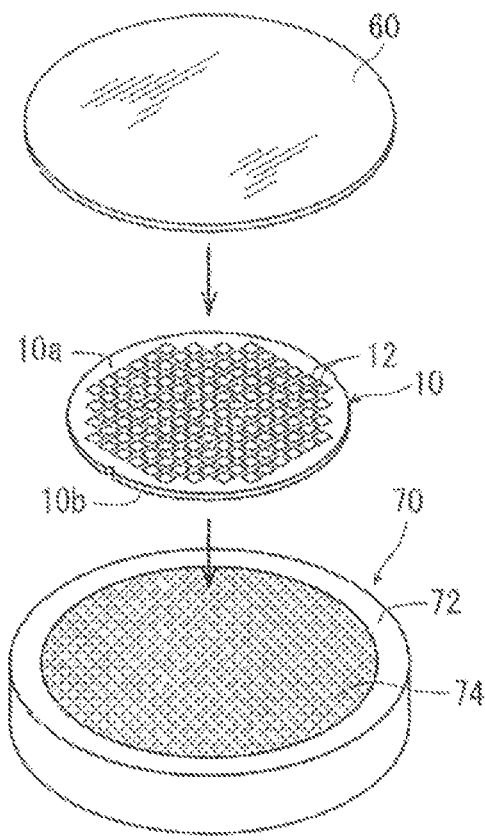
FIGS. 3A and 3B are perspective views depicting an embodiment of a thermocompression bonding sheet laying step.
Figure 3B:
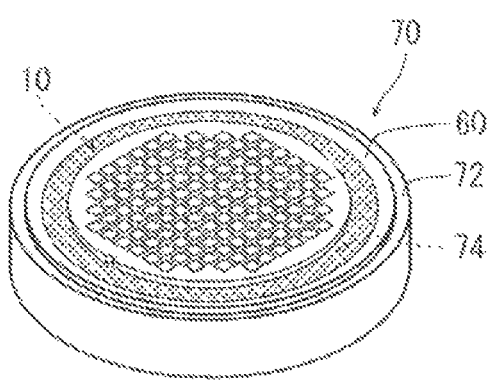

After the cutting step is conducted as above, a thermocompression bonding sheet laying step is carried out next. Referring to FIGS. 3A and 3B, the thermocompression bonding sheet laying step will be described below.

At the time of performing the thermocompression bonding sheet laying step, the wafer 10 subjected to cutting by the cutting step is conveyed to a thermocompression bonding apparatus 70 (only a part is depicted) depicted in FIG. 3A. The thermocompression bonding apparatus 70 includes a suction table 72, and a gas-permeable suction chuck 74 is configured at an upper surface of the suction table 72. The wafer 10 conveyed to the thermocompression bonding apparatus 70 is placed on the center of the suction chuck 74, with a back surface 10b side directed downward. Next, as depicted in FIG. 3B, a thermocompression bonding sheet 60 is laid from above such as to cover at least the whole part of the suction chuck 74. Note that the thermocompression bonding sheet 60 is set in a size at least larger than the outside diameter of the suction chuck 74, preferably in a size slightly smaller than the outside diameter of the suction table 72, as depicted in FIGS. 3A and 3B.

The thermocompression bonding sheet 60 is suitably a polyolefin-based sheet or a polyester based sheet. In the case of adopting the polyolefin-based sheet, the sheet is preferably selected from a polyethylene (PE) sheet, a polypropylene (PP) sheet, and a polystyrene (PS) sheet, and in the case of adopting the polyester-based sheet, the sheet is preferably selected from either a polyethylene terephthalate (PET) sheet or a polyethylene naphthalate (PEN) sheet. Note that, in the present embodiment, the following description will be made on the assumption that a polyethylene sheet is selected as the thermocompression bonding sheet 60. Note that a glue layer is not formed on that adhesion surface of the thermocompression bonding sheet 60 which faces the wafer 10. By such an operation, the thermocompression bonding sheet laying step is completed.

Figure 4A:
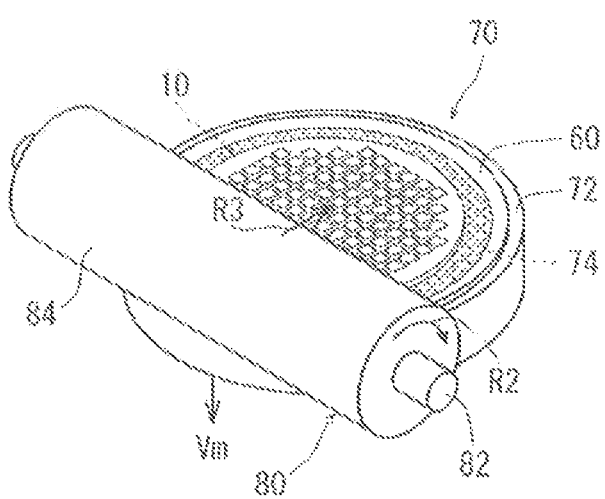
FIG. 4A is a perspective view depicting an embodiment of a thermocompression bonding step.
Figure 4B:
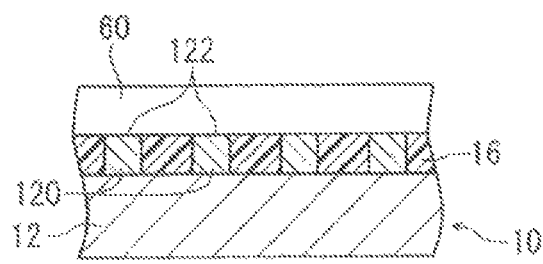
FIG. 4B is a partial enlarged sectional view of the wafer depicted in FIG. 4A.
Figure 4C:
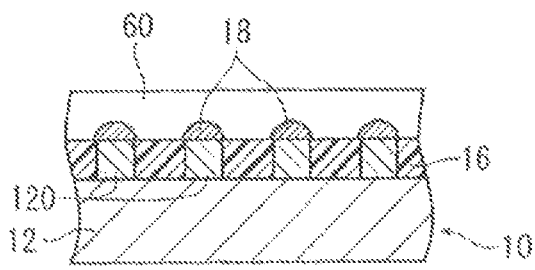
FIG. 4C is a partial enlarged sectional view of another embodiment of FIG. 4B.

After the thermocompression bonding sheet laying step is conducted as above, a thermocompression bonding step is carried out next. Referring to FIGS. 4A to 4C, the thermocompression bonding step will be described below.

After the thermocompression bonding sheet 60 is laid on the suction table 72 as mentioned above, the unillustrated suction source is operated to cause a negative pressure Vm to act on the suction table 72, whereby the wafer 10 placed on the suction chuck 74 and the thermocompression bonding sheet 60 are sucked. Next, as illustrated in FIG. 4A, thermocompression bonding means 80 (only a part is depicted) is located on the thermocompression bonding sheet 60. The thermocompression bonding means 80 includes a heating roller 84 held to be rotatable in the direction indicated by an arrow R2 with a rotational shaft 82 as a center. A surface of the heating roller 84 is coated with a fluoro-resin such that adhesion will not occur even when the thermocompression bonding sheet 60 is heated and an adhesive force is produced. An electric heater and a temperature sensor are incorporated (omitted from illustration) in the inside of the heating roller 84, and the surface of the heating roller 84 is adjusted to a desired temperature by a controller prepared separately.

After the thermocompression bonding means 80 is located on the thermocompression bonding sheet 60, the thermocompression bonding sheet 60 is pressed while being heated by the heating roller 84, and, while the heating roller 84 is rotated in the direction indicated by the arrow R2, as illustrated in FIG. 4A, the heating roller 84 is moved in the direction indicated by an arrow R3 along the surface of the thermocompression bonding sheet 60. The heating temperature at the time of heating the thermocompression bonding sheet 60 by the heating roller 84 is set in the range of 120° C. to 140° C. This heating temperature is a temperature in the vicinity of the melting point of the polyethylene sheet constituting the thermocompression bonding sheet 60, and is a temperature at which the thermocompression bonding sheet 60 is not excessively melted but is softened and exhibits pressure sensitive adhesiveness. At the time when the thermocompression bonding sheet 60 is pressed, the negative pressure Vm is acting on the suction chuck 74 through the suction table 72 as described above, so that air remaining between the front surface 10a of the wafer 10 and the thermocompression bonding sheet 60 is completely removed by suction, and, as illustrated in FIG. 4B, the surface where the metallic surfaces 122 of the electrodes 120 are exposed and the thermocompression bonding sheet 60 make close contact with each other, undergo thermocompression bonding over the wafer 10, and are integrated with each other in a state in which the surface of the wafer 10 is shielded from outside air. By such an operation, the thermocompression bonding step is completed.

In the present embodiment, the thermocompression bonding sheet 60 undergoes thermocompression bonding to the wafer 10, whereby direct contact of the metallic surfaces 122 of the projection-shaped electrodes 120 formed on the devices 12 with the outside air is avoided, and formation of an oxide film on the metallic surfaces 122 of the electrodes 120 is restrained until the thermocompression bonding sheet 60 is peeled off. In addition, with the thermocompression bonding sheet 60 having undergone thermocompression bonding, direct adhesion of contaminants to the metallic surfaces 122 of the electrodes 120 of the devices 12 is also prevented.

Note that the present invention is not limited to the above-described embodiment; for example, at any timing after the cutting step but before the thermocompression bonding step is performed, a plating step (for example, electroplating or the like) may be applied to the metallic surfaces 122 of the electrode 120 subjected to cutting, to form plating layers 18, as illustrated in FIG. 4C. As a result, a circuit will securely be formed between the electrodes 120 and a circuit board upon bonding which is conducted subsequently, and the bonding is further restrained from being hampered.

Figure 5:
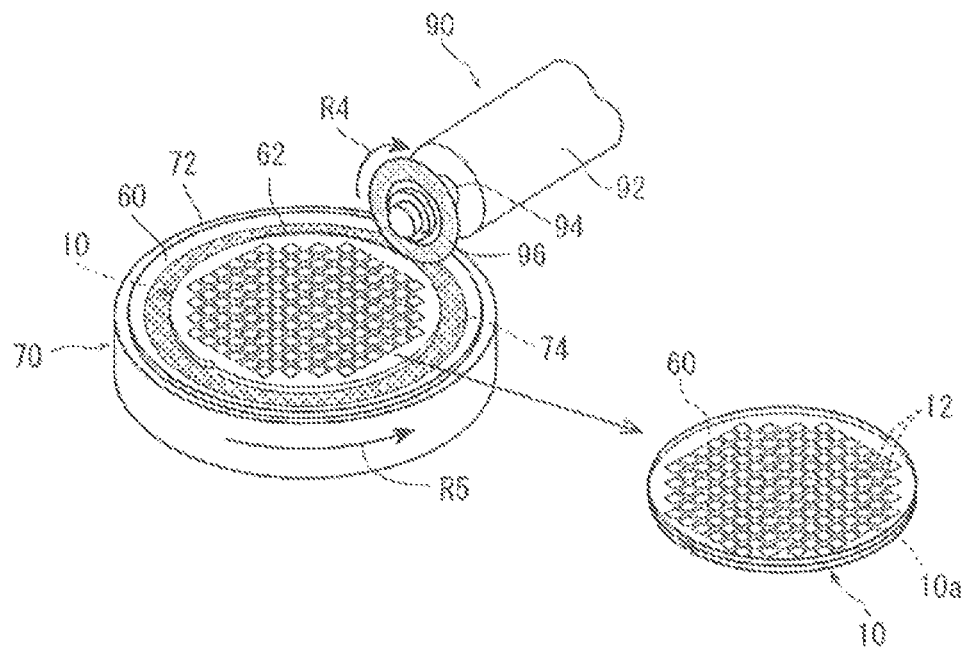
FIG. 5 is a perspective view depicting an embodiment of an outer periphery removing step.

After the above thermocompression bonding step is conducted, preferably, an outer periphery removing step is performed in which an outer peripheral region 60a of the thermocompression bonding sheet 60 protruding from the wafer 10 is removed, as depicted in FIG. 5. This outer periphery removing step is carried out, for example, by use of cutting means 90 (only a part is depicted) depicted in the figure. The cutting means 90 includes a spindle unit 92, a rotating spindle 94 is supported by the spindle unit 92, and a disk-shaped cutting blade 96 is mounted to a tip portion of the rotating spindle 94. An unillustrated driving motor is disposed at a rear end portion of the spindle unit 92, and the cutting blade 96 is rotationally driven at a desired rotational speed in the direction indicated by an arrow R4 together with the rotating spindle 94.

For carrying out the outer periphery removing step, as illustrated in FIG. 5, the suction table 72 is located under the cutting means 90, the cutting blade 96 is located at a boundary between an outer peripheral region protruding from the wafer 10 and an inside region thereof, of the thermocompression bonding sheet 60, the cutting blade 96 is rotated in the direction of the arrow R4 and put into cutting-in feeding by the thickness of the thermocompression bonding sheet 60 from above, and the suction table 72 is rotated in the direction indicated by an arrow R5, to form a cut groove 62 (indicated by a thick line) along the outer periphery of the wafer 10. When the cut groove 62 is formed ranging over the whole circumference along the outer periphery of the wafer 10, the outer peripheral region of the thermocompression bonding sheet 60 is separated from the inside region and is removed. After the outer peripheral region of the thermocompression bonding sheet 60 is removed, the unillustrated suction source having caused the negative pressure Vm to act on the suction table 72 is stopped. As a result, as depicted in FIG. 5, the wafer 10 integrated with the thermocompression bonding sheet 60 is conveyed out from the thermocompression bonding apparatus 70.

After the thermocompression bonding step and the outer periphery removing step that is performed if necessary are carried out as mentioned above, a back grinding step may be performed such as to process the wafer 10 integrated with the thermocompression bonding sheet 60 to a desired thickness. To perform the back grinding step, the wafer 10 integrated with the thermocompression bonding sheet 60 is conveyed to a grinding apparatus 100, as depicted in FIG. 6.

Figure 6:
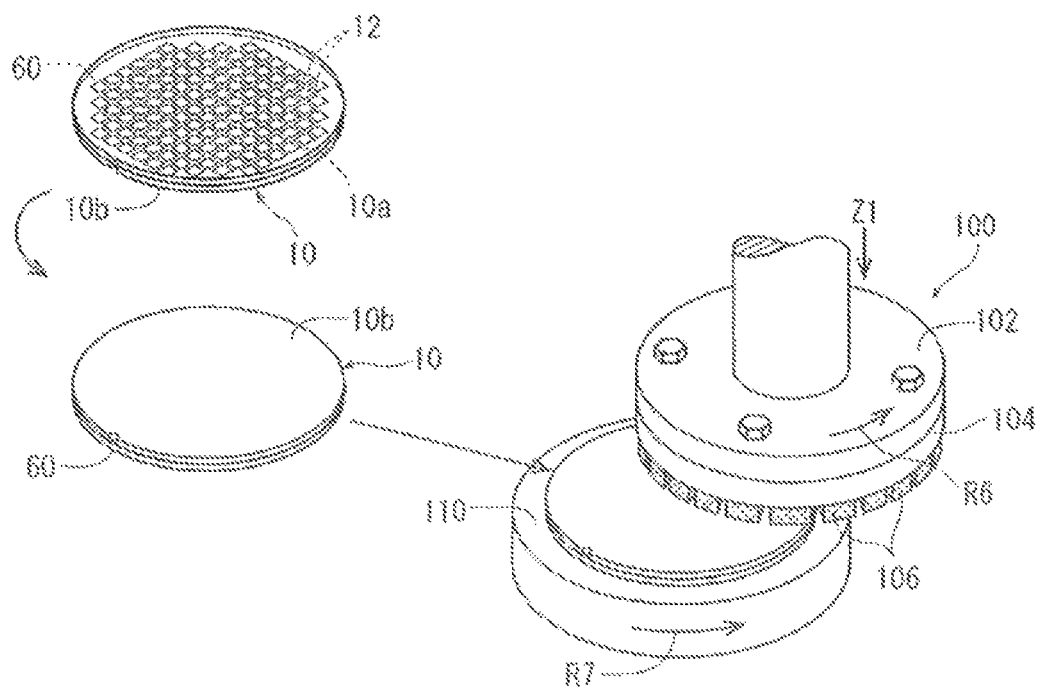
FIG. 6 is a perspective view depicting an embodiment of a back grinding step.

The wafer 10 conveyed to the grinding apparatus 100 (only a part is depicted) depicted in FIG. 6 is placed on a chuck table 110 of the grinding apparatus 100 after being inverted such that the side of the thermocompression bonding sheet 60 adhered to the front surface 10a side is on the lower side. A gas-permeable suction surface connected to unillustrated suction means is disposed at an upper surface of the chuck table 110, and, by operating the suction means, the wafer 10 is held under suction on the chuck table 110. In addition to the chuck table 110, the grinding apparatus 100 includes a wheel mount 102 rotated by an unillustrated electric motor, a grinding wheel 104 mounted to a lower surface of the wheel mount 102, and a plurality of grindstones 106 arranged in an annular pattern on a lower surface of the grinding wheel 104.

After the wafer 10 is held under suction on the chuck table 110, as illustrated in FIG. 6, the grinding wheel 104 is rotated at, for example, 6,000 rpm in the direction indicated by an arrow R6 in the figure, whereas the chuck table 110 is rotated at, for example, 300 rpm in the direction indicated by an arrow R7, and, simultaneously, unillustrated grinding feeding means is operated to bring the grindstones 106 into contact with the back surface 10b of the wafer 10 from above, and grinding feeding in the direction indicated by an arrow Z1 is conducted at a grinding feeding speed of 1 μm/sec, for example. In this case, grinding is advanced while the thickness of the wafer 10 is measured by an unillustrated measuring gauge, to grind the wafer 10 to a desired thickness. By such an operation, the back grinding step is completed. Note that, in the present embodiment, as described above, the thermocompression bonding sheet 60 is preliminarily adhered to the front surface 10a of the wafer 10, and the surface of adhesion of the thermocompression bonding sheet 60 is placed on the chuck table 110 and suction holding is conducted, so that it is unnecessary to newly adhere a protective tape or the like at the time of carrying out the back grinding step.

After the wafer 10 is integrated with the thermocompression bonding sheet 60 as described above, the devices 12 formed on the wafer 10 are divided into the individual device chips, which are each bonded onto a predetermined circuit board. Before bonding the electrodes 120 of the device 12 to the circuit board, a dividing step for dividing the wafer 10 into the individual device chips is thus conducted.

Figure 7A:
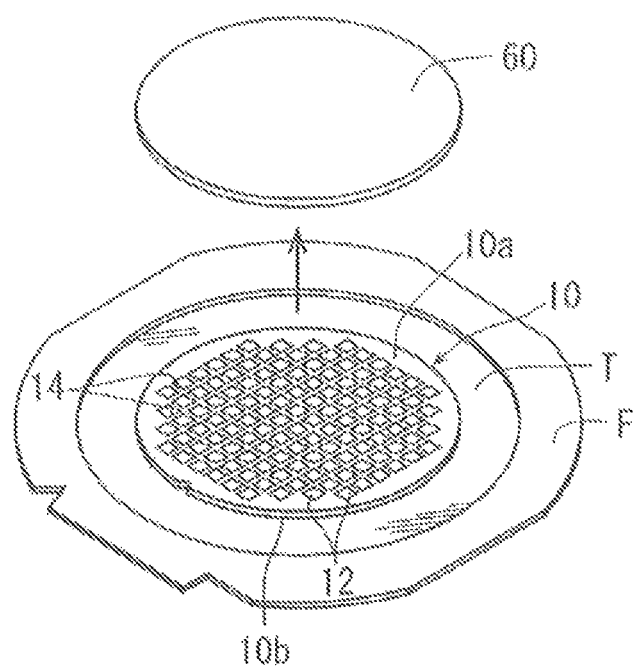
FIG. 7A is a perspective view depicting an embodiment of a peeling step.
Figure 7B:
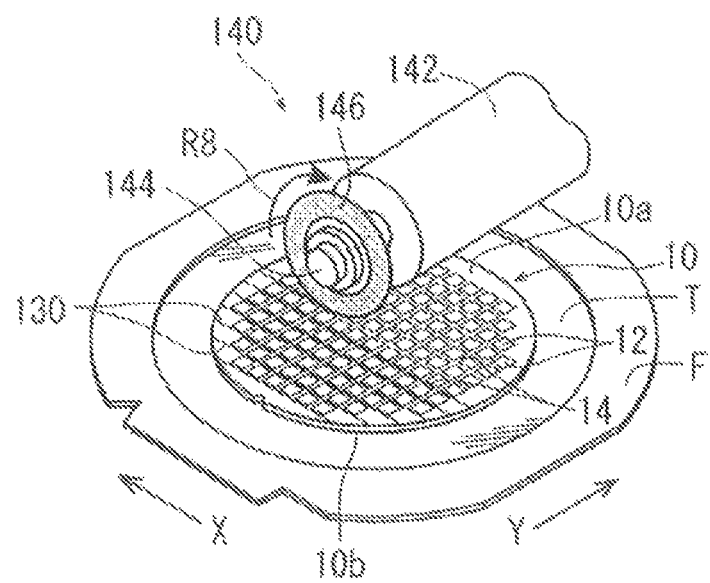
FIG. 7B is a perspective view depicting an embodiment of a dividing step.

At the time of performing the dividing step, as depicted in FIG. 7A, an annular frame F is prepared, the wafer 10 is located in the center of an opening capable of accommodating the wafer 10, with the front surface 10a side directed upward, and the wafer 10 is adhered to an adhesive tape T and is held by the frame F. After the wafer 10 is thus held on the frame F through the adhesive tape T, before the dividing step is conducted, the thermocompression bonding sheet 60 is peeled off as illustrated in FIG. 7A. After the thermocompression bonding sheet 60 is peeled off from the front surface 10a of the wafer 10, the wafer 10 is conveyed to a cutting apparatus 140 (only a part is depicted) depicted in FIG. 7B.

The cutting apparatus 140 includes a chuck table omitted from illustration and includes a spindle unit 142. The spindle unit 142 rotatably supports a rotating spindle 144, and a disk-shaped cutting blade 146 is mounted to a tip portion of the rotating spindle 144. An unillustrated driving motor is disposed at a rear end portion of the spindle unit 142, and the cutting blade 146 is rotationally driven at a desired rotating speed in the direction indicated by an arrow R8 together with the rotating spindle 144. The chuck table can be moved in an X-axis direction indicted by an arrow X by unillustrated moving means, and the spindle unit 142 can be moved in a Y-axis direction indicated by an arrow Y orthogonal to the X-axis direction and in the vertical direction orthogonal to both the X-axis direction and the Y-axis direction by unillustrated moving means.

The wafer 10 conveyed to the cutting apparatus 140 is placed and held on the chuck table together with the frame F, and a to-be-cut position (street 14) of the wafer 10 is detected by unillustrated alignment means (alignment). Based on position information obtained by carrying out the alignment, a tip portion of the cutting blade 146 is positioned at a predetermined processing starting position and is located at a depth for cutting the wafer 10. After the cutting blade 146 is positioned at the processing starting position, the chuck table holding the wafer 10 is moved in the X-axis direction along the street 14 of the wafer 10, to form a division groove 130 for dividing the wafer 10 into individual devices. Further, while indexing feeding of the spindle unit 142 is appropriately performed in the Y-axis direction, the division grooves 130 are formed along the remaining streets 14 parallel to the predetermined direction. After the division grooves 130 are formed along all the streets 14 along the predetermined direction, the chuck table is rotated by 90 degrees, and the division grooves 130 for cutting the wafer 10 are formed along all the streets 14 formed in the direction orthogonal to the predetermined direction. As a result, the plurality of devices 12 having been formed on the wafer 10 are individually divided from the wafer 10, to be device chips. The devices 12 made into the individual device chips are conveyed to a bonding step and are each appropriately bonded to a circuit board.

According to the present embodiment, until the wafer 10 is divided into the individual device chips and the device chips are bonded to the circuit boards, the thermocompression bonding sheet 60 is put in thermocompression bonding to the front surface 10a of the wafer 10, so that the metallic surfaces 122 of the electrodes 120 exposed on the devices 12 are shielded from outside air. Therefore, an oxide film is not formed on the metallic surfaces 122 of the electrodes 120 and the metallic surfaces 122 are not contaminated, preventing the bonding from being hampered. Further, since the thermocompression bonding sheet 60 is peeled off from the wafer 10 at the time of performing the bonding, it is ensured that burs, if any, remaining on the electrodes 120 on the devices 12 are removed together with the thermocompression bonding sheet 60.

Note that while the thermocompression bonding sheet 60 is peeled off from the front surface 10a of the wafer 10 at the time of performing the dividing step in the above-described embodiment, the device chips divided individually may not be immediately bonded to the circuit boards after the dividing step is conducted; in the case where there is some time until the bonding, the devices 12 may be divided into the individual device chips in the state in which the thermocompression bonding sheet 60 is adhered onto the wafer 10, and, thereafter, the thermocompression bonding sheet 60 may be peeled off from the device chips at the time of bonding the device chips to the circuit boards.

In addition, while a polyethylene sheet is used for the thermocompression bonding sheet 60 in the above embodiment, the present invention is not limited to this, and the thermocompression bonding sheet 60 may be appropriately selected from polyolefin-based sheets and polyester-based sheets.

In the case of selecting the thermocompression bonding sheet 60 from the polyolefin-based sheets, the sheet may not only be the polyethylene sheet selected in the above embodiment but also be one selected from either a polypropylene sheet or a polystyrene sheet.

In the case of selecting the polypropylene sheet as the thermocompression bonding sheet 60, the heating temperature at the time of performing the thermocompression bonding step is preferably 160° C. to 180° C. Besides, in the case of selecting the polystyrene sheet as the thermocompression bonding sheet 60, the heating temperature at the time of performing the thermocompression bonding step is preferably 220° C. to 240° C.

Further, in the case of selecting the thermocompression bonding sheet 60 from the polyester-based sheets, the sheet may be selected from either a polyethylene terephthalate sheet or a polyethylene naphthalate sheet.

In the case where the polyethylene terephthalate sheet is selected as the thermocompression bonding sheet 60, the heating temperature at the time of performing the thermocompression bonding step is preferably 250° C. to 270° C. Besides, in the case where the polyethylene naphthalate sheet is selected as the thermocompression bonding sheet 60, the heating temperature at the time of performing the thermocompression bonding step is preferably 160° C. to 180° C.

As described above, the thermocompression bonding sheet 60 can be appropriately selected from a polyethylene sheet, a polypropylene sheet, a polystyrene sheet, a polyethylene terephthalate sheet, and a polyethylene naphthalate sheet.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer formed on a front surface thereof with a plurality of devices having projection-shaped electrodes, the devices being partitioned by streets, the wafer processing method comprising:
    a cutting step of holding a back surface of the wafer by a holding surface of a chuck table and cutting head portions of the projection-shaped electrodes by a cutting tool slewed in parallel to the holding surface, to make uniform the electrodes in height and to expose metallic surfaces of the electrodes;
    a thermocompression bonding sheet laying step of laying a thermocompression bonding sheet on the front surface of the wafer;
    a thermocompression bonding step of heating and pressing the thermocompression bonding sheet to perform thermocompression bonding; and
    a peeling step of peeling off the thermocompression bonding sheet before dividing the wafer into individual device chips and bonding the electrodes to a circuit board.

2. The wafer processing method according to claim 1, further comprising:
    a plating step of forming a plating layer on the metallic surfaces formed at the head portions of the electrodes, after the cutting step but before performing the thermocompression bonding step.

3. The wafer processing method according to claim 1, wherein the thermocompression bonding sheet is a polyolefin-based sheet or a polyester-based sheet.

4. The wafer processing method according to claim 1, wherein the thermocompression bonding sheet is one of a polyethylene sheet, a polypropylene sheet, a polystyrene sheet, a polyethylene terephthalate sheet, and a polyethylene naphthalate sheet.

5. The wafer processing method according to claim 1, wherein the thermocompression bonding sheet is a polyethylene sheet, and
    a heating temperature when heating the thermocompression bonding sheet in the thermocompression bonding step is 120° C. to 140° C.

6. The wafer processing method according to claim 1, wherein the thermocompression bonding sheet is a polypropylene sheet, and
    a heating temperature when heating the thermocompression bonding sheet in the thermocompression bonding step is 160° C. to 180° C.

7. The wafer processing method according to claim 1, wherein the thermocompression bonding sheet is a polystyrene sheet, and
    a heating temperature when heating the thermocompression bonding sheet in the thermocompression bonding step is 220° C. to 240° C.

8. The wafer processing method according to claim 1, wherein the thermocompression bonding sheet is a polyethylene terephthalate sheet, and
    a heating temperature when heating the thermocompression bonding sheet in the thermocompression bonding step is 250° C. to 270° C.

9. The wafer processing method according to claim 1, wherein the thermocompression bonding sheet is a polyethylene naphthalate sheet, and
    a heating temperature when heating the thermocompression bonding sheet in the thermocompression bonding step is 160° C. to 180° C.

10. The wafer processing method according to claim 2, wherein the thermocompression bonding sheet is a polyolefin-based sheet or a polyester-based sheet.

11. The wafer processing method according to claim 2, wherein the thermocompression bonding sheet is one of a polyethylene sheet, a polypropylene sheet, a polystyrene sheet, a polyethylene terephthalate sheet, and a polyethylene naphthalate sheet.

12. The wafer processing method according to claim 2, wherein the thermocompression bonding sheet is a polyethylene sheet, and a heating temperature when heating the thermocompression bonding sheet in the thermocompression bonding step is 120° C. to 140° C.

13. The wafer processing method according to claim 2, wherein the thermocompression bonding sheet is a polypropylene sheet, and
a heating temperature when heating the thermocompression bonding sheet in the thermocompression bonding step is 160° C. to 180° C.

14. The wafer processing method according to claim 2, wherein the thermocompression bonding sheet is a polystyrene sheet, and
a heating temperature when heating the thermocompression bonding sheet in the thermocompression bonding step is 220° C. to 240° C.

15. The wafer processing method according to claim 2, wherein the thermocompression bonding sheet is a polyethylene terephthalate sheet, and
a heating temperature when heating the thermocompression bonding sheet in the thermocompression bonding step is 250° C. to 270° C.

16. The wafer processing method according to claim 2, wherein the thermocompression bonding sheet is a polyethylene naphthalate sheet, and
a heating temperature when heating the thermocompression bonding sheet in the thermocompression bonding step is 160° C. to 180° C.

\* \* \* \* \*